United States Patent [19]

Pohl

[11] Patent Number: 4,518,677
[45] Date of Patent: May 21, 1985

[54] PROCESS FOR MAKING PRINTING PLATES

[75] Inventor: Rudolph L. Pohl, Landenberg, Pa.

[73] Assignee: Hercules Incorporated, Wilmington, Del.

[21] Appl. No.: 598,113

[22] Filed: Apr. 9, 1984

Related U.S. Application Data

[63] Continuation-in-part of Ser. No. 394,565, Jul. 2, 1982, Pat. No. 4,442,302, which is a continuation-in-part of Ser. No. 175,171, Aug. 4, 1980, abandoned, which is a continuation-in-part of Ser. No. 20,778, Mar. 15, 1979, abandoned, which is a continuation-in-part of Ser. No. 866,964, Jan. 4, 1978, abandoned.

[51] Int. Cl.$^3$ .......................... G03F 7/02; G03C 5/24
[52] U.S. Cl. .................................. 430/306; 430/285; 430/309; 430/331; 430/325
[58] Field of Search ............... 430/285, 309, 306, 331, 430/325

[56] References Cited

U.S. PATENT DOCUMENTS

| | | | |
|---|---|---|---|
| 2,760,863 | 8/1956 | Plambeck | 96/5.6 |
| 3,256,226 | 6/1966 | Fekete et al. | 560/199 |
| 3,305,523 | 2/1967 | Burnside | 260/46.5 |
| 3,485,732 | 12/1969 | D'Alelio | 560/199 |
| 3,485,733 | 12/1969 | D'Alelio | 560/199 |
| 3,794,494 | 2/1974 | Kai et al. | 96/35.1 |
| 3,910,992 | 10/1975 | Skillicorn | 560/199 |
| 4,085,018 | 4/1978 | Ariga et al. | 204/159.15 |
| 4,092,443 | 5/1978 | Green | 427/53 |
| 4,137,081 | 1/1979 | Pohl | 430/306 |

FOREIGN PATENT DOCUMENTS

1253757 11/1971 United Kingdom.
1479630 7/1977 United Kingdom.
1531351 11/1978 United Kingdom.

OTHER PUBLICATIONS

French, "Functionally Terminated Butadiene Polymers", Rubber Chemistry and Technology, vol. 42, pp. 71–109, (1969).

*Primary Examiner*—John E. Kittle
*Assistant Examiner*—Cynthia Hamilton
*Attorney, Agent, or Firm*—Marion C. Staves

[57] ABSTRACT

It has been found that excellent quality photopolymer printing plates having resistance to alcohol-based inks can be prepared by (a) spreading a photopolymer composition comprising a chain extended, liquid, terminally olefinically unsaturated polymer; from about 1% to about 50% by weight based on the weight of the polymer of at least one ethylenically unsaturated monomer; from about 0.1% to about 10% by weight based on the weight of the polymer of photoinitiator; and from about 0.01% to about 2% by weight based on the weight of the polymer of a stabilizer on a support to form a photopolymer element, (b) exposing to actinic light selected areas of said photopolymer composition on said support until substantial cross-linking takes place in the exposed areas without significant cross-linking in the unexposed areas, and (c) removing the unexposed areas of photopolymer composition by washing the plate with an aqueous detergent solution.

3 Claims, No Drawings

PROCESS FOR MAKING PRINTING PLATES

This application is a continuation-in-part of application Ser. No. 394,565, filed July 2, 1982, now U.S. Pat. No. 4,442,302, which in turn is a continuation-in-part of application Ser. No. 175,171, filed Aug. 4, 1980, now abandoned which in turn is a continuation-in-part of application Ser. No. 20,778, filed Mar. 15, 1979, now abandoned, which in turn is a continuation-in-part of application Ser. No. 866,964, filed Jan. 4, 1978, now abandoned.

Compositions capable of being converted under the influence of actinic light to solid, insoluble, tough structures have become increasingly important in the preparation of printing plates. Such compositions are disclosed in U.S. Pat. No. 2,760,863 to Plambeck. In the process of the Plambeck patent, printing plates are produced directly by exposing to actinic light through an image-bearing transparency a layer of an essentially transparent composition containing an addition polymerizable, ethylenically unsaturated monomer and an addition polymerization initiator activatable by actinic light. The layer of polymerizable composition is supported on a suitable support, and exposed to actinic light until substantial polymerization of the composition has occurred in the exposed areas. The unchanged material in the unexposed areas is then removed, as by treatment with a suitable solvent in which the polymerized composition is insoluble. This results in a raised relief image which corresponds to the transparent image areas of the transparency and which is suitable for use as a printing plate.

Photopolymerizable layers of the type in the Plambeck patent generally are prepared from polymeric components which are soluble in organic solvents. Accordingly, development of the printing plates requires the use of organic solvents. Due to the toxicity, high volatility and generally low flash point of organic solvents, their use often gives rise to hazardous conditions. As a consequence, photopolymer layers which are soluble in water or aqueous alkali were developed. In U.S. Pat. No. 3,794,494, water or aqueous alkali dispersible compositions are described which are suitable for use in flexographic printing plate preparation. These compositions comprise combinations of unsaturated polyesters, unsaturated monomers and a photopolymerization initiator. However, flexible printing plates suitable for use in flexographic printing using alcohol-based inks cannot be prepared using compositions of the type described in U.S. Pat. No. 3,794,494 because the quick drying alcohol-based inks cause the cured compositions to swell and disintegrate.

A photopolymer composition has been discovered which is dispersible in aqueous detergent solutions and, after photo-curing, is not affected by typical alcohol-based printing inks. While the compositions are not water soluble, they are sufficiently fluid and water dispersible that unexposed portions of printing plates made from the photopolymer composition can be removed by washing with dilute aqueous solutions of a detergent.

This invention relates to the process of making printing plates embodying a layer of the above mentioned novel photopolymer composition. The plates resulting from the process are resilient, flexible abrasion-resistant structures useful as flexographic printing plates applicable for use with alcohol-based inks. A typical polymer useful in the process of this invention comprises a liquid terminally olefinically unsaturated polymer which is prepared by chain extending an excess of carboxyl terminated polybutadiene with a difunctional epoxy resin and then reacting with glycidyl methacrylate to give a polymer with methacrylate end groups. Typical polymer compositions include (1) e.g., the above-described polymer, (2) at least one ethylenically unsaturated, addition polymerizable monomer, (3) photoinitiator, and (4) thermal polymerization inhibitor.

The novel photopolymer compositions used in the process of this invention comprise (1) a liquid linear polymer having a number average molecular weight of preferably at least about 3000 and containing at least two terminal olefin groups attached to the polymer through a combination of at least two ester groups; (2) from about 1% to about 50%, preferably from about 25% to about 50%, by weight based on the liquid polymer of at least one ethylenically unsaturated monomer; (3) from about 0.05% to about 10%, preferably from about 0.1% to about 5%, by weight of the polymer composition of photoinitiator and (4) about 0.01% to about 2%, preferably from about 0.01% to about 1%, by weight of the polymer composition of thermal polymerization inhibitor.

The process of this invention comprises (1) admixing the components of the above novel photopolymer composition, (2) spreading the photopolymer composition in a layer on a support to form a photopolymer element, (3) exposing to actinic light selected areas of said layer on said support until substantial cross-linking takes place in the exposed areas without significant cross-linking in the unexposed areas and (4) removing the unexposed areas of photopolymer composition by washing the photopolymer element with an aqueous detergent solution.

The liquid polymer employed in this invention is prepared in two steps. In the first step, a polymer having a number average molecular weight of at least about 1000, selected from a linear butadiene, isoprene, chloroprene or isobutylene homopolymer or a linear butadiene-styrene, butadiene-acrylonitrile, butadiene-isoprene, or ethylene-1-butene copolymer containing carboxyl groups, or the corresponding products from which the olefinic unsaturation has been removed, as by hydrogenation (hereinafter referred to as telechelic polymers) is reacted with less than a molar equivalent amount of a difunctional compound which chain extends the telechelic polymer.

The reaction of the chain extending agent with the telechelic polymer serves to increase the molecular weight and the viscosity of the polymer, and to incorporate ester groups in the linear polymer chain, the terminal groups of the chain extended polymer being the same as in the original telechelic polymer.

In the second step the terminal carboxyl groups present on the chain extended polymer are reacted with a molar equivalent or greater amount of an epoxy compound containing polymerizable unsaturation (such as glycidyl acrylate or glycidyl methacrylate).

Functionally terminated polymers and copolymers (e.g., telechelic polymers) useful for preparing these terminally unsaturated polymers are prepared by a free radical polymerization using special catalysts or by anionic polymerization followed by capping the polymer by carbon dioxide, ethylene oxide, etc., as described in an article by French in *Rubber Chemistry and Technology*, Vol. 42, pages 71–107 (1969).

As noted above, a variety of difunctional chain extending agents may be used in this invention. In general, diepoxides may be used as chain extending agents. The diepoxides useful as chain extending agents have two epoxy groups per molecule. They can be saturated or unsaturated, aliphatic, aromatic or heterocyclic, monomeric or polymeric. Useful epoxides include, for example:

(a) Epoxy terminated resins which are the products of the reaction between epichlorohydrin and Bisphenol A. The simplest resin derived from this reaction is 2,2-bis(p-(epoxypropoxy)phenyl) propane, generally known as the diglycidyl ether of Bisphenol A. These resins are the preferred epoxides.

(b) glycol epoxy resins having the structure:

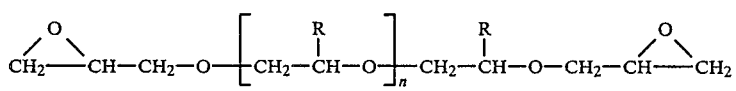

wherein R is H or $C_1$-$C_3$ alkyl and n=0-7.

(c) Epoxidized hydrocarbons, such as vinylcyclohexene dioxide, butadiene dioxide, dicyclopentadiene dioxide, limonene dioxide and epoxidized polybutadiene.

(d) glycidyl esters of dicarboxylic acids, such as azelaic acid, terephthalic acid and dimerized unsaturated fatty acids (dimer acids).

(e) cycloaliphatic epoxy resins such as:

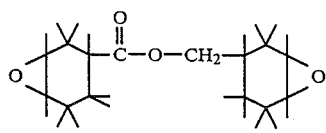

or

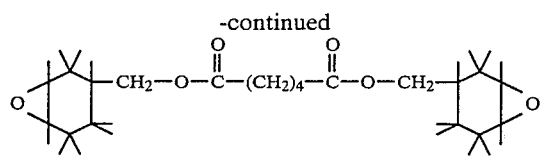

(f) Mixtures of the above diepoxy compounds.

Certain monofunctional epoxides can be used in combination with the above difunctional epoxides to reduce viscosity or improve physical properties of the cured resin. Examples of suitable materials include butyl glycidyl ether, phenyl glycidyl ether, cresyl glycidyl ether or 1,2-epoxy alkanes containing 8 to 30 carbon atoms.

The reaction between a carboxyl terminated polybutadiene and the diglycidyl ether of Bisphenol A, in the first step, and the reaction of that product with glycidyl methacrylate in the second step is depicted below in order to illustrate the type of reactions involved in the preparation of the liquid prepolymers useful in this invention.

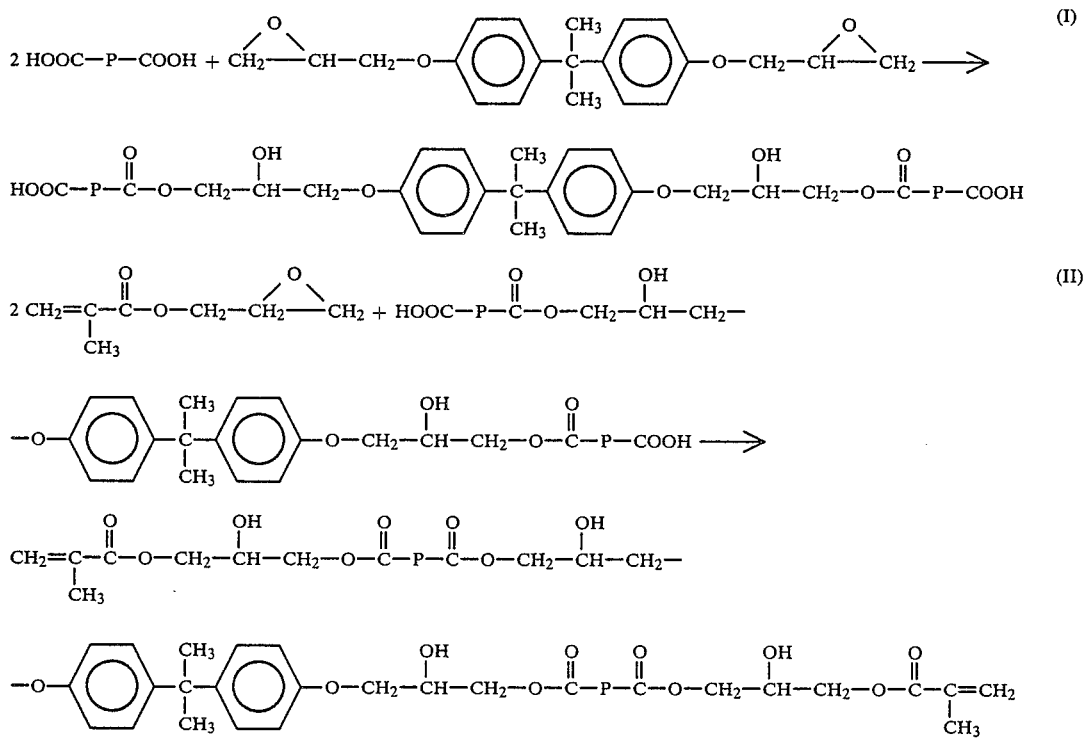

wherwein P=polybutadiene.

In this illustration the ratio of terminal functional groups in the telechelic polymer to functional groups in the difunctional chain extender is two to one, the two materials being used in 2:1 molar amounts. At this ratio, complete reaction between the two materials results in two molecules of the telechelic polymer being joined by one molecule of the chain extending agent with one functional terminal group of each telechelic polymer being unaffected. If more chain extending agent is employed, the reaction leads to further chain extension, e.g. at a ratio of 1.2:1 of terminal functional groups in the polymer to functional groups on the chain extender six moles of the polymer would be joined by five moles of the chain extender. Thus, the products of equations (I) and (II) above would become:

polymer and the epoxy compound, leading to side chain polymerizable unsaturation in the polymer in addition to that at the chain ends.

The resulting liquid prepolymers are viscous liquids, having a number average molecular weight of preferably at least about 3000, and Brookfield viscosities at 25°

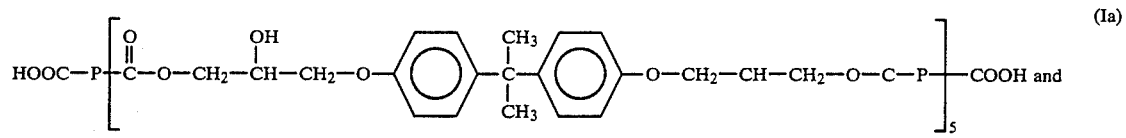

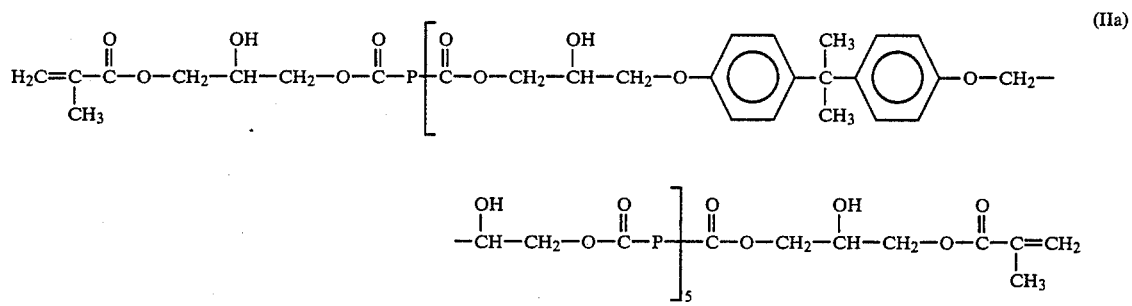

With a higher than 2:1 ratio of terminal functional groups in the polymer to chain extending epoxide groups only part of the telechelic polymer molecules would become chain extended. A ratio of between 10:1 and 1.2:1 of functional groups in the telechelic polymer to functional groups in the chain extending agent is operable in this invention, with a ratio of 3:1 to 2:1 being preferred.

One skilled in the art will recognize that when the terminal carboxyl groups on the telechelic polymer are reacted with an epoxide two isomers are formed. For example, equation (I) above could also be represented as:

C., between 100,000 and 3,000,000 centipoises.

The reaction between the epoxide group in the GMA and the terminal carboxylic group can be run between 25° C. and 200° C. with a temperature range of 100°–125° C. being preferred. An acid or basic catalyst can be used to reduce the required reaction temperature and time. Some useful catalyst are sodium hydroxide, sodium ethoxide, trimethylamino, triethylbenzyl ammonium chloride, hydrogen chloride, and boron trifluoride etherate. The preferred catalysts are tertiary amines, such as trimethylamine or benzyldimethylamine. Generally, about 0.001% to about 5% by weight catalyst is used, with about 0.25% by weight being a particularly preferred amount when using the tertiary amines.

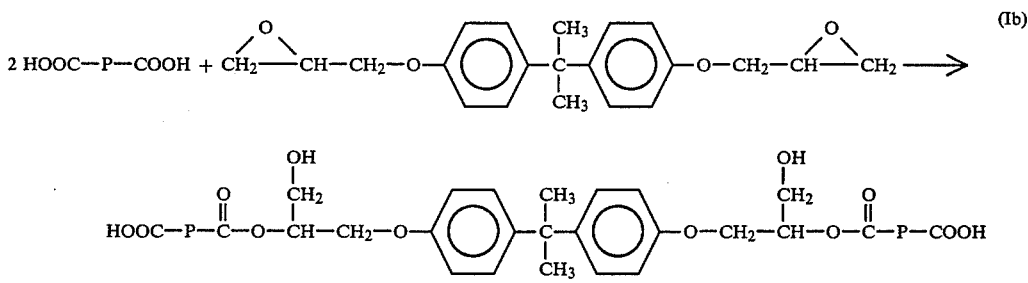

It is understood that, in all cases involving the reaction of epoxides, this invention includes both isomers, although only one of them may be illustrated.

As indicated in equation II, two moles of glycidyl methacrylate (GMA) were reacted with each mole of chain extended polymer in this illustration. Generally, however, a slight excess of GMA would be used (e.g. 2.3 moles per mole of polymer) to insure complete conversion of the chain extended polymer to a terminally unsaturated form.

With the above exemplary polymer it is also possible to use a large excess of GMA. In this case the excess GMA will react with the hydroxyl groups formed by the initial reaction between the functionally terminated To make the liquid prepolymer with only terminal double bonds, close to a stoichiometric amount of epoxide (GMA) and a basic catalyst should be used. To make a branched polymer, a large excess of epoxide (GMA) and an acidic catalyst is preferred.

The chain extended telechelic polymer containing terminal carboxyl groups is reacted with an epoxy compound containing polymerizable unsaturation in order to incorporate terminal polymerizable unsaturation into the chain extended polymer. This reaction is illustrated, P' being used to represent the terminal diradical of the chain extended telechelic polymer and R being H or $C_1$–$C_3$ alkyl.

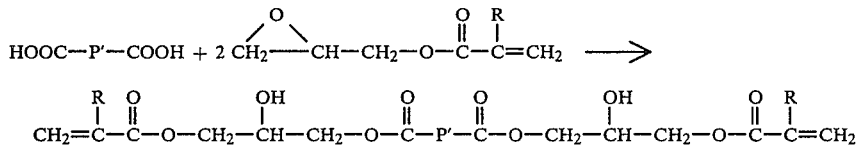

(III)

In the above illustrative equations, two moles of glycidyl acrylate (the "capping" compound) are reacted with each mole of the chain extended telechelic polymer. Generally, a slight excess of "capping" compound would be used (e.g. 2.3 moles of "capping" compound per mole of polymer) to insure complete conversion of the chain extended polymer to a terminally unsaturated form. However, it is not necessary that the terminal functional groups on the chain extended telechelic polymers be reacted completely with the "capping" compound. In some cases, in order to obtain a more flexible composition, crosslinked to a lower degree on photopolymerization, it is desirable that some of the polymers be incompletely "capped".

The liquid prepolymer is as follows:

Prepolymers prepared from a diepoxide and a carboxyl terminated polymer having the structure:

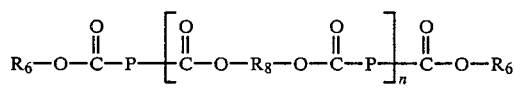

wherein P is a polymer residue selected from homopolymers of butadiene, isoprene, chloroprene and isobutylene and copolymers of butadiene with styrene, butadiene with acrylonitrile, butadiene with isoprene and ethylene with 1-butene, and the corresponding saturated residues; $R_6$ is

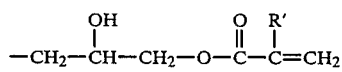

where R' is —H and —$CH_3$, and n is 1–5, and $R_8$ is selected from

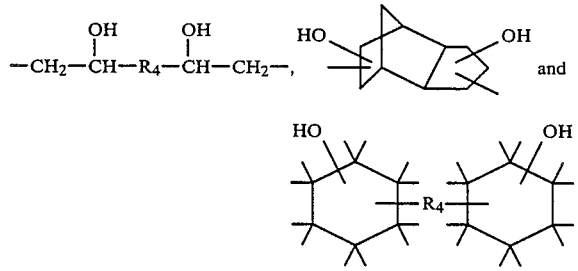

where each —OH and free valence bond is on an adjoining carbon atom and $R_4$ is selected from aliphatic, cycloaliphatic and aromatic radicals, most preferably aliphatic hydrocarbon, cycloaliphatic hydrocarbon and aromatic hydrocarbon radicals, containing up to 30 carbon atoms with 0–2 ester linkages or 0–7 ether linkages.

As previously stated, the photopolymer compositions of this invention comprise (1) the above-described liquid prepolymers, (2) at least one ethylenically unsaturated, addition polymerizable monomer, (3) photoinitiator and (4) thermal polymerization inhibitor. The ethylenically unsaturated monomer components can be monofunctional, difunctional or polyfunctional as described below.

Useful monofunctional ethylenically unsaturated monomers include acrylonitrile, methacrylonitrile, styrene, 2-methylstyrene, alpha-p-dimethylstyrene, N-vinyl pyrrolidone, acrylic acid, methacrylic acid, esters of acrylic acid and methacrylic acid containing up to 22 carbon atoms, acrylamide, methacrylamide, mono and di-N-alkyl substituted acrylamides and methacrylamides containing up to 10 carbons in the alkyl group, and diacetone acrylamide.

A useful trifunctional ethylenically unsaturated monomer is 1,3,5-triacryloyl-hexahydro-1,3,5-triazine. This compound and related compounds such as the corresponding methacryloyl derivative have the structural formula:

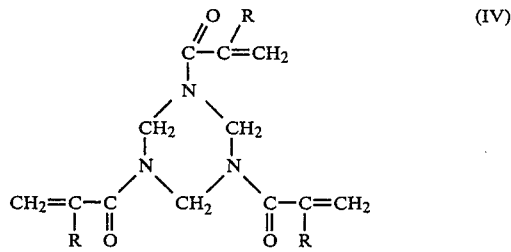

(IV)

wherein R is hydrogen or a $C_1$–$C_3$ alkyl group.

Other suitable difunctional monomers may be defined by the structural formula:

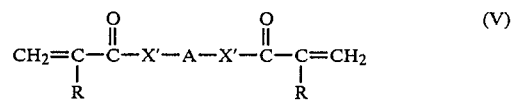

(V)

wherein R again is hydrogen or a $C_1$–$C_3$ alkyl group; both X's are either —NH— or —O— and A is alkylene, substituted alkylene or alkylene oxy alkylene. A preferred monomer having this formula is N,N'-oxydimethylene-bis(acrylamide). When X' in formula V above is —NH—, but A is alkylene or substituted alkylene, this is descriptive of another preferred monomer, N,N'-methylene-bis(acrylamide). This compound is one member of a valuable group of monomers represented by compounds having the formula

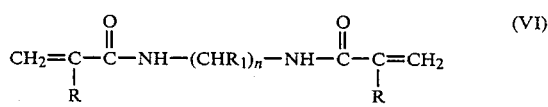

(VI)

wherein R is hydrogen or a $C_1$–$C_3$ alkyl group, $R_1$ is hydrogen, a $C_1$–$C_3$ alkyl group or phenyl, n is 1 to 6 and the total number of carbon atoms is —$(CHR_1)_n$— is no more than 10.

Representative of compounds of formula VI above are N,N'-methylene-bis(acrylamide), N,N'-methylene-bis(methacrylamide), N,N'-methylene-bis(2-ethylacrylamide), N,N'-methylene-bis(2-propylacrylamide), N,N'-ethylene-bis(acrylamide), N,N'-ethylene-bis(methacrylamide), N,N'-(1,6-hexamethylene)-bis-(acrylamide), N,N'-(1,6-hexamethylene)-bis(methacrylamide), N,N'-ethylidene-bis(acrylamide), N,N'-ethylidene-bis(methacrylamide), N,N'-benzylidene-bis(acrylamide), N,N'-butylidene-bis(methacrylamide) and N,N'-propylidene-bis-(acrylamide). These compounds may be prepared by conventional reactions well known in the art, as for example, in U.S. Pat. No. 2,475,846.

Also useful monomers are those wherein X' in formula V above is —O—. When A is alkylene or substituted alkylene, the compounds are di-, tri and tetra-acrylates of certain polyhydric alcohols. These acrylates may be illustrated by the general formula

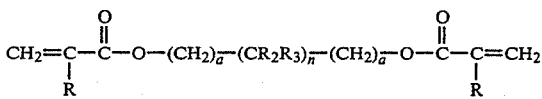

(VII)

wherein R is hydrogen or a $C_1$–$C_3$ alkyl group, a is 0 or 1, $R_2$ is hydrogen, a $C_1$–$C_3$ alkyl group,

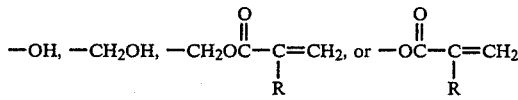

$R_3$ is hydrogen, a $C_1$–$C_3$ alkyl group, —$CH_2OH$ or

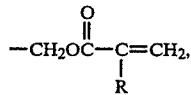

n is 1 to 6 and the total number of carbon atoms in —$(CR_2R_3)_n$— is no more than 11. Representative of these compounds are ethylene glycol diacrylate, ethylene glycol dimethacrylate, ethylene glycol di(2-ethylacrylate), ethylene glycol di(2-propylacrylate), 1,3-propylene glycol diacrylate, 1,4-butylene glycol diacrylate, 1,5-pentanediol dimethacrylate, glycerol diacrylate, glycerol triacrylate, trimethylolpropane triacrylate, trimethylolpropane trimethacrylate, pentaerythritol diacrylate, pentaerythritol triacrylate, pentaerythritol tetramethacrylate and pentaerythritol tetraacrylate.

Closely related to the preceding acrylates are those which are derived from di-, tri- and tetra-ethylene glycol and di- and tri-propylene glycol. These compounds are those of formula V wherein X' is —O— and a is alkylene oxy alkylene, and they may be more specifically illustrated by the formula

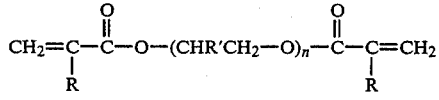

(VIII)

wherein R is hydrogen or a $C_1$–$C_3$ alkyl group, R' is hydrogen or methyl, n is 2 to 4 when R' is hydrogen and is 2 to 3 when R' is methyl. Representative of these compounds are diethylene glycol diacrylate, diethylene glycol dimethacrylate, triethylene glycol diacrylate, triethylene glycol dimethacrylate, tetraethylene glycol diacrylate, tetraethylene glycol dimethacrylate, dipropylene glycol diacrylate, dipropylene glycol dimethacrylate, tripropylene glycol diacrylate and tripropylene glycol dimethacrylate.

While a single unsaturated monomer may be employed alone in the photopolymer composition, mixtures of two or more monomers are generally employed together to obtain best results. In any event, the amount of monomer or monomers used to effect cross-linking of the polymer component of the compositions of this invention will be from about 1 to about 50%, most preferably from about 5 to about 25% by weight based on the liquid terminally unsaturated polymer.

the photoinitiators useful in the photopolymer compositions of this invention are generally well known and some are characterized by being photoreducible. They are compounds which absorb actinic light very strongly and thus become activated to the point where they will abstract hydrogen atoms from compounds which are hydrogen donors. By so doing, the photoinitiator is itself reduced and the hydrogen donor is converted into a free radical. Representative compounds are benzophenone, 2-chlorobenzophenone, 4-methoxybenzophenone, 4-methylbenzophenone, 4,4'-dimethylbenzophenone, 4-bromobenzophenone, 2,2',4,4'-tetrachlorobenzophenone, 2-chloro-4'-methylbenzophenone, 4-chloro-4'-methylbenzophenone, 3-methylbenzophenone, 4-tert-butylbenzophenone, benzoin, benzoin methyl ether, benzoin ethyl ether, benzoin isopropyl ether, benzoin isobutyl ether, benzoin acetate, benzil, benzilic acid, methylene blue, acetophenone, 2,2-diethoxyacetophenone, 9,10-phenathrenequinone, 2-methyl anthraquinone, 2-ethylanthraquinone, 2-tert-butylanthraquinone, and 1,4-naphthoquinone. Particularly suitable are 2,2-diethoxyacetophenone, 2,2-dimethoxy-2-phenylacetophenone, benzoin isopropyl ether, benzoin isobutyl ether, and 2-ethyl anthraquinone. Also applicable are combinations of carbonyl sensitizer compounds and certain organic amine activators as disclosed in U.S. Pat. No. 3,759,807. In general, the photoinitiator should linking when the compositions of this invention are prepared or during storage. Such stability also minimizes, during exposure, any cross-linking in the unexposed areas caused by the heat generated in the cross-linking reaction and by the heat transmitted through the opaque sections of the transparency. The amount of photoinitiator will be from about 0.05% to about 10%, most preferably from about 0.1% to about 5% by weight based on the weight of the polymer in the photopolymer composition.

For the purpose of inhibiting premature cross-linking during thermal processing and storage of the photopolymer compositions of this invention, the incorporation of a thermal polymerization inhibitor and inhibitors is desirable. Such stabilizers also are well known in the art, and they are exemplified by di-t-butyl-p-cresol, hydroquinone monomethylether, pyrogallol, quinone, hydroquinone, methylene blue, t-butyl catechol, hydroquinone monobenzyl ether, methyl hydroquinone, amyl quinone, amyloxy hydroquinone, n-butyl phenol, phenol, hydroquinone monopropyl ether, phenothiazine and nitrobenzene, used separately or in combination. When used in an amount within the range of from about 0.01% to about 2% by weight of the polymer, these stabilizers are quite effective in preventing cross-linking of the photopolymer composition during processing and storage. During exposure such amounts of stabilizer also delay and thus prevent cross-linking due to scattered light in the non-exposed areas of the composition, but do not greatly interfere with or delay the cross-linking of the composition in strongly exposed areas, thus aiding in formation of a plate of optimum depth and surface configuration.

The photopolymer compositions also may contain up to about 55% by weight of an inert particulate filler which is essentially transparent to actinic light. Representative of such fillers are the organophilic silicas, the bentonites, silica and powdered glass, all having a particle size less than 0.4 mil in their maximum dimension. Particles of 0.1 micron or less in size are preferred. Such fillers can impart desirable properties to the compositions and reliefs of this invention. Futhermore, the light scattering effected by the particulate fillers broadens the image toward the base of the plate so that the half-tone dots take on the appearance of truncated cones in cross-section. Such dots are stronger and have less tendency to break off than dots which are more cylindrical in cross-section.

When the photopolymer compositions of this invention are exposed to actinic light at a wave length of from about 3000 A to about 4000 A through a photographic negative or positive, the polymer beneath the exposed areas becomes insolubilized, whereas the polymer beneath the unexposed areas remains water dispersible. Subsequent washing of the plate removes the dispersible polymer, leaving a replica of the negative or positive in relief. Washing will normally be carried out with dilute aqueous solution of an anionic or nonionic detergent. Anionic detergents such as alpha-olefin sulfonates, alkylaryl sulfonates, lauryl sulfate, alkyl esters of sulfosuccinic acid, or sulfated ethylene oxide condensates of alkyl phenols or fatty alcohols, and nonionic detergents such as alkyl phenol, fatty alcohol or fatty acid ethylene oxide condensates may be used. Alpha-olefin sulfonates are particularly useful. Detergent concentrations of about 0.2% to 2% will normally be employed, generally at temperatures of 25°–60° C. Development may frequently be accelerated by brushing or scrubbing. In large scale work, application of the water solvent will advantageously be carried out by means of jets or sprays. In some instances, it may be helpful to use minor quantities of organic solvents such as the short chain aliphatic alcohols and ketones. Suitable solvents of these types include methanol, ethanol and acetone, and they generally will be used in amounts no greater than 25–35%, preferably less than 1–5% of the water or aqueous detergent developer. Following development of the plate, residual surface water, and any organic solvent which also might be present, may be removed by passing a current of warm air over the relief. In some instances it may be desirable to post-expose or post-cure the plates by exposing to actinic light at the wave lengths recited above, after the uncross-linked photopolymer composition has been washed away.

The printing reliefs made in accordance with this invention are most applicable to those classes of printing wherein a distinct difference in height between printing and nonprinting areas is required. These classes include those wherein the ink is carried by the raised portion of the relief, such as in dry off-set printing and ordinary letterpress printing. Because of the flexibility, abrasion resistance, resilience, and alcohol resistance of the relief plates prepared using these compositions, they are particularly useful for flexographic printing in which alcohol based inks are employed.

This invention is illustrated by the following examples in which all parts are by weight unless otherwise specified.

EXAMPLE 1

This example illustrates the preparation of a prepolymer from a carboxyl terminated polybutadiene, the diglycidyl ether of Bisphenol A (an aromatic diepoxide) and glycidyl methacrylate.

Into a 1 liter, 3 necked flask equipped with a stirrer, a thermometer, a gas inlet tube, and a gas outlet tube are charged 500 g. (0.21 equivalents) of a carboxyl terminated polybutadiene (acid No.=23.0), 16.0 g. of the diglycidyl ether of Bisphenol A and 1.25 g. of N,N-dimethylbenzylamine catalyst. The flask is then sparged with nitrogen and heated to 100° C. After 3 hours at 100° C., the acid number of the reaction mixture is 15.8.

Dry air is sparged through the reaction mixture for twenty minutes. A solution of 25.9 g. (0.18 equivalents) of glycidyl methacrylate 0.20 g. of butylated hydroxytoluene and 0.075 g. of phenothiazine (polymerization inhibitors) is added to the reaction flask. The flask is maintained at 100° C. for an additional seven hours and then cooled.

The product has a Brookfield viscosity of 469,800 cps at 25° C. and an acid number of 1.1. The number average molecular weight, Mn, is 4920 and the weight average molecular weight, Mw, is 22,700. Both molecular weights are determined by gel permeation chromatography (GPC) using polystyrene calibration standards.

EXAMPLE 2

This example illustrates the preparation of a photosensitive composition from the prepolymer described in Example 1 and the determination of some of the properties of this resin.

A portion of the prepolymer described in Example 1 (240 g.) is stirred with 80 g. of lauryl methacrylate, 40 g. of of 1,3-butylene glycol dimethacrylate, 40 g. of cyclohexyl methacrylate and 1.29 g. of 2,2-dimethoxy-2-phenylacetophenone at room temperature until a completely homogeneous solution is obtained (1 hour).

The photosensitive resin is poured into a rubber frame 0.08 in. thick. A glass plate is then placed over the frame. The resin is exposed at room temperature for 60 seconds to a bank of 10–30 watt ultraviolet fluorescent lights (Westinghouse F30T8/BL) set at a distance of 2.7 in. from the glass. The glass plate with the resin attached to it is separated from the mold and immersed in a wash bath containing a warm (50° C.) aqueous solution of 1.0% alpha-olefin sulfonate detergent. The unpolymerized liquid resin farthest from the glass is washed away. The portion of resin next to the glass (nearest the UV lights) has hardened. This hardened resin is peeled from the glass and dried. The thickness of the hardened layer is 0.031 inch.

Another sample of the polymer formulation is doctored onto a glass plate and covered with a thin (0.004 in.) polyester film. The layer of resin 0.040 in. thick is exposed to UV fluorescent lights for 20 seconds through the polyester film. The resin is then exposed to a 3 Kw medium pressure mercury arc lamp for 4.5 minutes through the glass. The entire 40-mil sample is hardened. Dumbbells are cut from the hardened resin and tensile properties measured. The hardened resin has a tensile strength of 1290 psi, an elongation of 130%, a tensile modulus of 370 psi, and Shore A hardness of 48.

When the 40-mil thick sample of the hardened resin is immersed in ethyl alcohol for 24 hours, it gains 4.0% in weight. A 24-hour immersion in a solution containing 90% ethyl alcohol and 10% n-propyl acetate causes a 8.6% gain in weight.

EXAMPLE 3

This example illustrates the use of the resin of Example 2 in the production and use of a printing plate.

A 0.030 inch thick layer of the photopolymer composition described in Example 2 is exposed to a mercury arc lamp for 180 seconds through an image bearing negative transparency. The liquid resin in the unexposed areas of the plate is washed away with a warm (55° C.) aqueous solution containing 1% nonylphenoxy poly(ethyleneoxy)ethanol and 0.25% sodium tripolyphosphate. The plate is then dried and exposed under a nitrogen atmosphere to ten 30 watt UV fluorescent tubes for 12 minutes. The resulting printing plate is completely tack free.

The plate is mounted on a Webtron flexographic press. The press is run at normal speed (250–300 fpm). About 10,000 impressions are run using a red flexo ink which contains as solvents 3% methyl alcohol, 73% ethyl alcohol, 10% isopropyl alcohol, 10% ethyl cellosolve, and 4% water. On completion of the run, visual examination of the plate indicates no sign of wear, swelling, or tack. The printed page is of high quality.

EXAMPLE 4

This example illustrates the preparation of a prepolymer from a carboxyl terminated polybutadiene, an aliphatic diepoxy resin and glycidyl methacrylate.

Into a 2 liter resin kettle equipped with a stirrer, a thermometer, a gas inlet tube and a gas outlet tube are charged 1000 g. (0.42 equivalents) of a carboxyl terminated polybutadiene, 53.8 g. (0.168 equivalents) of a diglycol epoxy resin known as DER 732 (sold by Dow Chemical Co.) and 0.25% of N,N-dimethylbenzylamine. The flask is then sparged with nitrogen and heated to 100°–105° C. After 3.5 hours at 100° C., the acid number of the reaction mixture is 16.3.

Dry air is sparged through the flask for twenty minutes. A solution of 54.5 g. (0.38 equivalents) of glycidyl methacrylate, 2.0 g. of butylated hydroxytoluene and 0.15 g. of phenothiazine is added. The flask is maintained at 100° C. for an additional 6.5 hours and cooled.

The product has an acid number of 1.9 and a Brookfield viscosity of 151,000 cps at 25° C. The number average molecular weight, Mn, is 4490 and the weight average molecular weight, Mw, is 20,000. Both molecular weights are determined by GPC using polystyrene calibration.

EXAMPLE 5

A portion of the prepolymer described in Example 4 (77 g.) is blended with 17 g. of lauryl methacrylate, 6.0 g. of 1,3-butylene glycol dimethacrylate, and 0.6 g. of 2,2-dimethoxy-2-phenylacetophenone until the resin is completely homogeneous (~1 hour). The Brookfield viscosity of the photosensitive resin is 19,500 cps at 25° C.

When the resin is poured into a rubber frame and exposed to ultraviolet fluorescent lights for 60 seconds as described in Example 2, 0.028 inch of hardened resin is formed. A sample of cured resin 0.040 inch thick is prepared by exposing the resin to ultraviolet fluorescent lights and a mercury arc lamp as described in Example 2. This sample of hardened resin has a tensile strength of 530 psi, an elongation of 115%, a tensile modulus of 300 psi and a Shore A hardness of 47. Sections of the 40-mil thick sample of cured resin are immersed in various solvents commonly used in inks and the percent weight gain after 24 hours immersion is determined. The results are tabulated below.

TABLE I

| Solvent | % Wt. Change After 24 Hours Immersion |
| --- | --- |
| Ethyl Alcohol | +6.2 |
| 90% Ethyl Alcohol 10% Propyl Acetate | +10.3 |
| Hexane | +55 |
| Water | −1.0 |
| 77% Water 17% Isopropyl Alcohol 6% Concentrated Ammonium Hydroxide | +0.7 |

EXAMPLE 6

This example illustrates the preparation of a prepolymer from a carboxyl terminated copolymer of butadiene and acrylonitrile, and diglycidyl ether of Bisphenol A and glycidyl methacrylate.

Into a 2 liter resin kettle equipped with a stirrer, a thermometer and a gas inlet and outlet tubes are charged 1313 g. (0.745 equivalents, acid no. 31.9) of a carboxyl terminated copolymer of butadiene and acrylonitrile, 77.8 g. (0.48 equivalents) of the diglycidyl ether of Bisphenol A and 3.3 g. of N,N-dimethylbenzylamine. The reaction mixture is maintained under a nitrogen atmosphere at 100° C. for 7 hours. The acid number is 9.4. Dry air is sparged through the reaction mixture for 20 minutes and a solution of 58.3 g. of glycidyl methacrylate, 3.9 g. of butylated hydroxy toluene and 0.078 g. of phenothiazine is added to the reactor. The flask is maintained at 100° C. for an additional hour and then cooled.

The product has an acid number of 2.7 and a Brookfield viscosity of 700,000 cps. at 25° C.

A photosensitive composition is prepared by blending 256 g. of this prepolymer with 120. g. of lauryl methacrylate, and 24 g. of 1,3-butylene glycol dimethacrylate and 2.4 g. of 2,2-dimethoxy-2-phenyl acetophenone at 40° C. until a homogeneous solution is obtained (~1 hour).

A 40 mil thick sample of this resin is then cured by exposure to UV lights and a mercury arc lamp as described in Example 2. The sample of hardened resin has a tensile strength of 680 psi, an elongation of 120%, a tensile modulus of 244 psi and a Shore A hardness of 41. When a sample of this cured resin is immersed in a solution of 90% ethyl alcohol and 10% propyl acetate for 24 hours, it increases only 13% in weight.

EXAMPLE 7

This example illustrates the preparation of a prepolymer from a carboxyl terminated butadiene with a mixture of an aromatic diepoxide and an aliphatic diepoxide.

Into a 2 liter resin kettle equipped with a stirrer, a thermometer, a gas inlet tube and a gas outlet tube are charged 1000 g. (0.41 equivalent, acid no.=23) of a carboxyl terminated butadiene, 21.2 g. (0.12 equivalents) of the diglycidyl ether of Bisphenol A, 31.8 g. (0.12 equivalents) of an aliphatic polyglycol epoxy resin (DER 736 resin sold by Dow Chemical Company) and 2.25 g. of N,N-dimethylbenzylamine. The kettle is then sparged with nitrogen and heated to 100° C. After 4 hours the acid number is 10.7. Air is sparged through the reaction mixture for twenty minutes and a solution of 31.8 g. (0.22 equivalents) of glycidyl methacrylate, 2.25 g. of butylated hydroxytoluene and 0.06 g. of phenothiazine is added. After an additional 4 hours at 100° C. the acid number is 1.3 and the reaction mixture is cooled to room temperature. The product has a Brookfield viscosity of 1,840,000 cps at 25° C.

A photosensitive composition is prepared by blending 240 g. of the above prepolymer with 88 g. of lauryl methacrylate, 24 g. of 1,3-butylene glycol dimethacrylate, 48 g. of 2-hydroxypropyl methacrylate and 7.2 g. of benzoin isobutyl ether at room temperature for one hour.

A 40 mil thick sample of this resin is then cured by exposure to UV lights and a mercury arc lamp as described in Example 2. The cured resin has a tensile strength of 910 psi, an elongation of 135%, a tensile modulus of 610 psi and a Shore A hardness of 57. This cured sample gains 19.4% in weight while immersed in a solution containing 90% ethyl alcohol and 10% propyl acetate for 24 hours.

EXAMPLE 8

This example illustrates the preparation of a prepolymer from a combination of a difunctional epoxy resin, a monofunctional epoxy resin and glycidyl methacrylate. In this example 17% of the final prepolymer is incompletely "capped", i.e. contains acrylate groups on only one end of the chain extended polymer, and 83% is fully "capped". The incompletely "capped" portion of the prepolymer contains a hydroxyester group from the monofunctional epoxide at the "uncapped" end.

The above described prepolymer is made by charging a 3 liter resin kettle equipped with a stirrer and a thermometer with 1000 g. (0.40 equivalents) of carboxyl terminated polybutadiene, 35.7 g. (0.20 equivalents) of the diglycidyl ether of Bisphenol A, 9.6 g. (0.04 equivalents) of 1,2-epoxyhexadecane, 2.5 g. of benzyldimethylamine and 3.0 g. of butylated hydroxytoluene.

The reaction mixture is heated to 100° C. for 5 hours. Then 32 g. (0.225 equivalents) of glycidyl methacrylate is added and the temperature maintained at 100° C. for an additional 7 hours. The Brookfield viscosity of the product is 1,490,000 cps at 25° C.

A photosensitive composition is prepared by blending 70 g. of the above described prepolymer with 24 g. of lauryl methacrylate, 6 g. of tetraethyleneglycol dimethacrylate and 1.0 g. of benzoin isopropyl ether at 45° C. for 2 hours. The resulting photosensitive composition is cured by exposure to UV lights as described in Example 2. The cured resin has a tensile strength of about 500 psi, an elongation of approximately 180% and a Shore A hardness of about 34.

EXAMPLE 9

This example illustrates the preparation of a photosensitive composition from the prepolymer described in Example 1 with the use of isobornyl methacrylate.

A portion of the prepolymer described in Example 1 (204 g.) is stirred with 42 g. of isobornyl methacrylate, 30 g. of lauryl methacrylate, 24 g. of hydroxypropyl methacrylate and 1.8 g. of 2,2-dimethoxy-2-phenylacetophenone at room temperature for 1 hour.

A sample of cured resin 0.040 inch thick is prepared by exposing the above resin to ultraviolet fluorescent lights and a mercury arc lamp as described in Example 2. The sample of hardened resin had a tensile strength of 700 psi, an elongation of 250%, a Young's modulus of 370 psi and a Shore A hardness of 46.

EXAMPLE 10

This example illustrates the preparation of a photosensitive composition from the prepolymer described in Example 1 with the use of dicylopentadienyloxyethyl methacrylate (sold by Rohm and Haas Co. under the name QM-657).

A portion of the prepolymer described in Example 1 (260 g.) is stirred with 124 g. of dicyclopentadienyloxyethyl methacrylate, 16 g. of 1,3-butyleneglycol dimethacrylate and 3.6 g. of 2,2-dimethoxy-2-phenylacetophenone at room temperature for 1 hour.

A sample of cured resin 0.040 inch thick is prepared by exposing the above resin to ultraviolet fluorescent lights and a mercury arc lamp as described in Example 2. The sample of hardened resin had a tensile strength of 920 psi, an elongation of 160%, a Young's modulus of 330 psi and a Shore A hardness of 46.

What I claim and desire to protect by Letters Patent is:

1. The process of making a printing relief which comprises:
   (A) admixing the components of a photopolymer composition comprising:
   (1) a liquid terminally olefinically unsaturated linear polymer having the structure

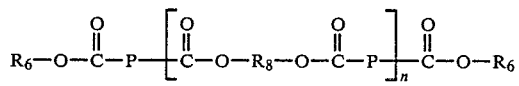

wherein P is a polymer residue having a number average molecular weight of at least about 1000, selected from the group consisting of homopolymers of butadiene, isoprene, chloroprene and isobutylene and copolymers of butadiene with styrene, butadiene with acrylonitrile, butadiene with isoprene and ethylene with 1-butene, and the corresponding saturated residues; $R_6$ is

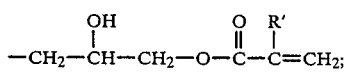

$R_8$ is selected from the group consisting of

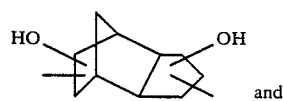

and

-continued

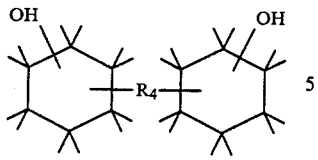

where each —OH group and free valence bond is on an adjoining carbon atom; $R_4$ is selected from the group consisting of aliphatic hydrocarbon, cycloaliphatic hydrocarbon and monocyclic aromatic hydrocarbon radicals containing up to 30 carbon atoms with 0–2 ester linkages or 0–7 ether linkages; R' is selected from the group consisting of —H and —$CH_3$ groups; and n=1–5;

(2) from about 1 to about 50% by weight based on the weight of the polymer of at least one ethylenically unsaturated monomer selected from the group consisting of acrylonitrile, methacrylonitrile, styrene, methyl substituted styrene, N-vinyl-pyrrolidone, and monomers containing one or more

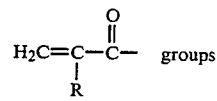 groups wherein R is hydrogen or a $C_1$–$C_3$ alkyl group;

(3) from about 0.05 to about 10% by weight based on the weight of the polymer of a photoinitiator; and (4) from about 0.01 to about 2% by weight based on the weight of the polymer of a stabilizer;

(B) spreading the photopolymer composition in a layer on a support to form a photopolymer element;

(C) exposing to actinic light selected areas of said layer on said support until substantial cross-linking takes place in the exposed areas without significant cross-linking in the unexposed areas; and (D) removing the unexposed areas of photopolymer composition by washing the photopolymer element with an aqueous detergent solution.

2. The process of claim 1 wherein the actinic light is at a wave length of from about 3000Å to about 4000Å.

3. The process of claim 1 wherein the aqueous detergent is an anionic or nonionic detergent.

* * * * *